United States Patent
Condon et al.

(10) Patent No.: US 8,219,949 B2
(45) Date of Patent: Jul. 10, 2012

(54) NONSEQUENTIAL HARDWARE DESIGN SYNTHESIS VERIFICATION

(75) Inventors: Robert J. Condon, West Linn, OR (US); Bryan D. Bowyer, Newberg, OR (US); Andres R. Takach, Wilsonville, OR (US)

(73) Assignee: Calypto Design Systems, Inc., Santa Clara, CA (US)

( * ) Notice: Subject to any disclaimer, the term of this patent is extended or adjusted under 35 U.S.C. 154(b) by 80 days.

(21) Appl. No.: 12/821,109

(22) Filed: Jun. 22, 2010

(65) Prior Publication Data

US 2011/0055779 A1 Mar. 3, 2011

Related U.S. Application Data

(60) Provisional application No. 61/219,287, filed on Jun. 22, 2009.

(51) Int. Cl.
*G06F 17/50* (2006.01)

(52) U.S. Cl. ......... 716/106; 716/101; 716/104; 716/108

(58) Field of Classification Search .................. 716/100, 716/101, 106, 108, 104
See application file for complete search history.

(56) References Cited

U.S. PATENT DOCUMENTS

| | | | | |
|---|---|---|---|---|
| 5,684,808 A | * | 11/1997 | Valind | 714/726 |
| 5,862,149 A | * | 1/1999 | Carpenter et al. | 714/726 |
| 5,956,256 A | * | 9/1999 | Rezek et al. | 716/108 |
| 6,385,757 B1 | * | 5/2002 | Gupta et al. | 716/102 |

* cited by examiner

*Primary Examiner* — Sun Lin
(74) *Attorney, Agent, or Firm* — Klarquist Sparkman, LLP

(57) ABSTRACT

Methods and apparatuses for verifying a concurrent logical design and a corresponding non-sequential algorithmic description are provided. In some implementations, verification of a non-sequential algorithmic description for a device design is facilitated by monitoring a simulation of the non-sequential algorithmic description and synchronizing the timing of selected events with timing from an already completed simulation of a corresponding logical design. With various implementations, the hierarchical blocks in the logical design are monitored during the prior simulation to record selected event information. Subsequently, the recorded event information may be used to synchronize the simulation of the non-sequential algorithmic description.

17 Claims, 6 Drawing Sheets

```
void A(int din, ac_channel<int> &p1,
ac_channel<int> &p2)
{
        // put multiples of 4 on the high
priority channel
        If (din % 4) p1.write(din);
        else p2.write(din);
} void B(ac_channel<int> &p1,
ac_channel<int> &p3)
{
        // calculation here will introduce
latency in
        // HW simulation.
        int s = 0;
        if (p1.available(1)) {
                int loop = p1.read();
                for (int i = 0; i < loop; i++)
s++;
                p3.write(s);
        }
} void C(ac_channel<int> &p2,
ac_channel<int> &p3, int &dout)
{
        // give p2 priority
        if (p2.available(1)) {
                dout = p2.read();
        else if (p3.available(1)) {
                dout = p3.read();
        }
} void top(int din, int& dout)
{
 static ac_channel<int> p1;
 static ac_channel<int> p2;
 static ac_channel<int> p3;

A(din, p1, p2);
 B(p1, p3);
 C(p2, p3, dout);
}
```

NONSEQUENTIAL HARDWARE DESIGN SYNTHESIS VERIFICATION

RELATED APPLICATIONS

This application claims priority under 35 U.S.C. §119(e) to U.S. Provisional Patent Application No. 61/219,287 entitled "Verification of Hardware Synthesized from Non-Sequential Designs," filed on Jun. 22, 2009, and naming Robert Condon et al. as inventors, which application is incorporated entirely herein by reference.

FIELD OF THE INVENTION

The invention relates to the field of electronic device design. More specifically, various implementations of the invention are directed towards facilitating the verification of logical designs synthesized from non-sequential algorithmic descriptions of a hardware design.

BACKGROUND OF THE INVENTION

Today, the design of electronic devices no longer begins with diagramming an electronic circuit. Instead, the design of modern electronic devices, and particularly integrated circuits ("IC's"), often begins at a very high level of abstraction. For example, a design may typically start with a designer creating a specification that describes particular desired functionality. This specification, which may be implemented in C, C++, SystemC, or some other programming language, describes the desired behavior of the device at a high level. Device designs at this level of abstraction are often referred to as "algorithmic designs," "algorithmic descriptions," or "electronic system level ("ESL") designs". Designers then take this algorithmic design, which may be executable, and create a logical design through a synthesis process. The logical design will often be embodied in a netlist. Frequently, the netlist is a register transfer level ("RTL") netlist.

Designs at the register level are often implemented by a hardware description language ("HDL") such as SystemC, Verilog, SystemVerilog, or Very High speed hardware description language ("VHDL"). A design implemented in HDL describes the operations of the design by defining the flow of signals or the transfer of data between various hardware components within the design. For example, an RTL design describes the interconnection and exchange of signals between hardware registers and the logical operations that are performed on those signals.

Designers subsequently perform a second transformation. This time, the register transfer level design is transformed into a gate level design. Gate level designs, like RTL designs, are also often embodied in a netlist, such as, a mapped netlist for example. Gate level designs describe the gates, such as AND gates, OR gates, and XOR gates that comprise the design, as well as their interconnections. In some cases, a gate level netlist is synthesized directly from an algorithmic description of the design, in effect bypassing the RTL netlist stage described above.

Once a gate level netlist is generated, the design is again taken and further transformations are performed on it. First the gate level design is synthesized into a transistor level design, which describes the actual physical components such as transistors, capacitors, and resistors as well as the interconnections between these physical components. Second, place and route tools then arrange the components described by the transistor level netlist and route connections between the arranged components. Lastly, layout tools are used to generate a mask that can be used to fabricate the electronic device, through for example an optical lithographic process.

In general, the process of generating a lower-level circuit description or representation of an electronic device (such as an RTL netlist or a gate level netlist), from a higher-level description of the electronic device (such as an algorithmic description,) is referred to as "synthesis." Similarly, a software application used to generate a lower-level design from a higher-level design is often referred to as a "synthesis tool."

Concurrent Designs

Modern hardware designs are becoming increasingly complex and often include multiple component blocks specially designed to perform particular tasks or functions. Additionally, these designs are often capable of concurrently processing multiple tasks simultaneously. As used herein, a "concurrent design," is a design that allows for the simultaneous execution of more than one process. In many cases, these simultaneously executing processes interact with each other. Design of "concurrent systems" is facilitated by the use of high-level algorithmic descriptions, as described above, wherein many of the functions defined by the algorithmic description are non-sequential. More particularly, many of the operations and functions (i.e. the non-sequential ones) do not have to be executed in a particular order.

Synthesizing a non-sequential algorithmic description for a circuit, results in a logical design that allows for the parallel execution of hardware processes. These concurrently executing processes share access to the same memory storage locations and often to the same data stored in memory. More particularly, a number of memory storage locations, such as, for example, a memory register, which will correspond to a variable in the algorithmic description, can be accessed by multiple processes. These shared memory locations are often referred to as "shared variables." The timing of access to these "shared variables" by the different concurrent processes can cause the results of the process to differ. Although both results are valid, as those of skill in the art can appreciate, verification of a non-sequential algorithmic description against a synthesized logical design is difficult due to the results differing depending upon event execution and timing.

SUMMARY OF THE INVENTION

Various implementations of the invention provide methods and apparatuses for verifying a concurrent logical design and a corresponding non-sequential algorithmic description. In some implementations, verification of a non-sequential algorithmic description for a device design is facilitated by monitoring a simulation of the non-sequential algorithmic description and synchronizing the timing of selected events with timing from an already completed simulation of a corresponding logical design. With various implementations, the hierarchical blocks in the logical design are monitored during the prior simulation to record selected event information. Subsequently, the recorded event information may be used to synchronize the simulation of the non-sequential algorithmic description.

BRIEF DESCRIPTION OF THE DRAWINGS

The present invention will be described by way of illustrative embodiments shown in the accompanying drawings in which like references denote similar elements, and in which:

FIG. 6 illustrates an algorithmic description corresponding to the device under test of FIG. 5.

DETAILED DESCRIPTION OF ILLUSTRATIVE EMBODIMENTS

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

Furthermore, in various implementations of the invention, a mathematical model may be employed to represent an electronic device. With some implementations, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, results in a different device design. More particularly, manipulation of the model results in a transformation of the corresponding physical design and any physical device rendered or manufactured by the device design. Additionally, those of skill in the art can appreciate that during many electronic design and verification processes, the response of a device design to various signals or inputs is simulated. This simulated response corresponds to the actual physical response the device being modeled would have to these various signals or inputs.

Figure 1:
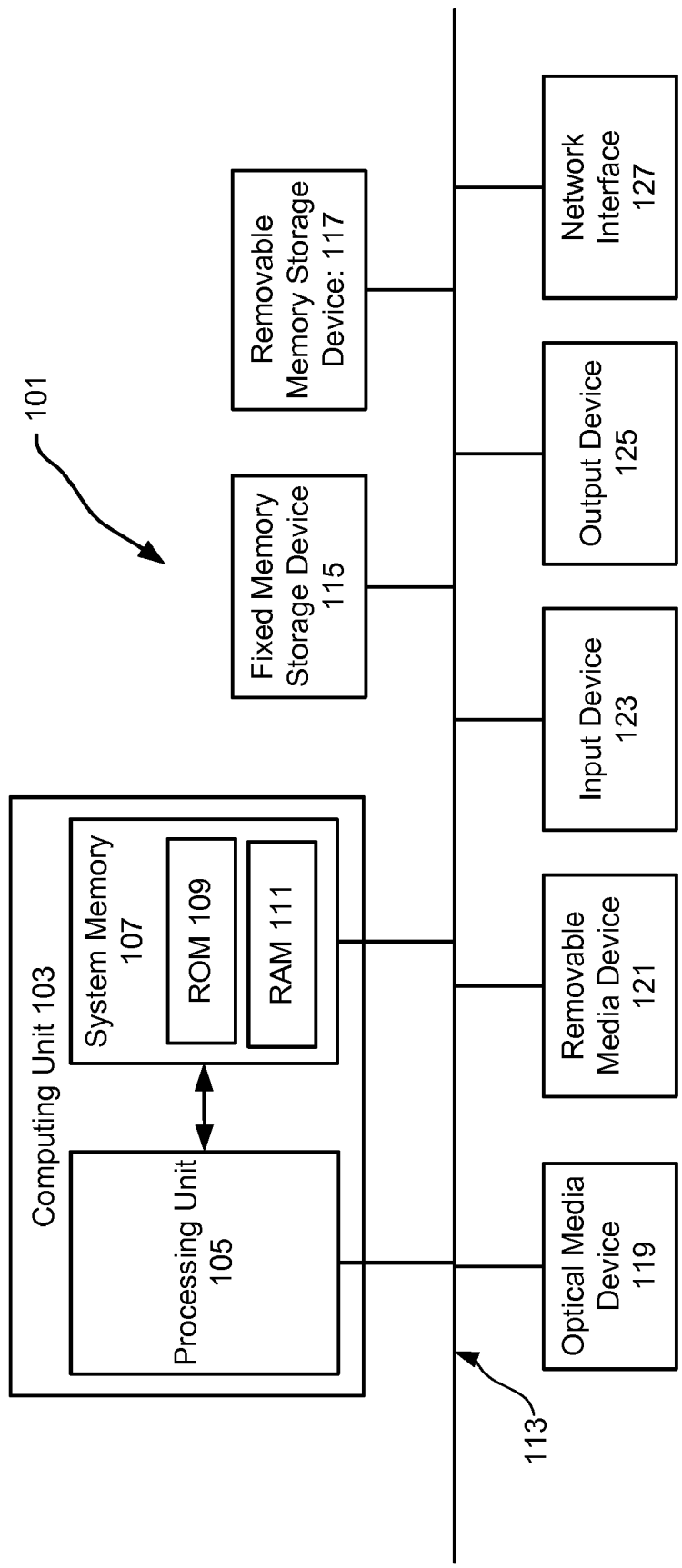
FIG. 1 shows an illustrative computing environment.

Some of the methods described herein can be implemented by software stored on a computer readable storage medium, or executed on a computer. Accordingly, some of the disclosed methods may be implemented as part of a computer implemented electronic design automation ("EDA") tool. The selected methods could be executed on a single computer or a computer networked with another computer or computers. For clarity, only those aspects of the software germane to these disclosed methods are described; product details well known in the art are omitted Illustrative Computing Environment As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Conventional Synthesis Verification

Figure 2:
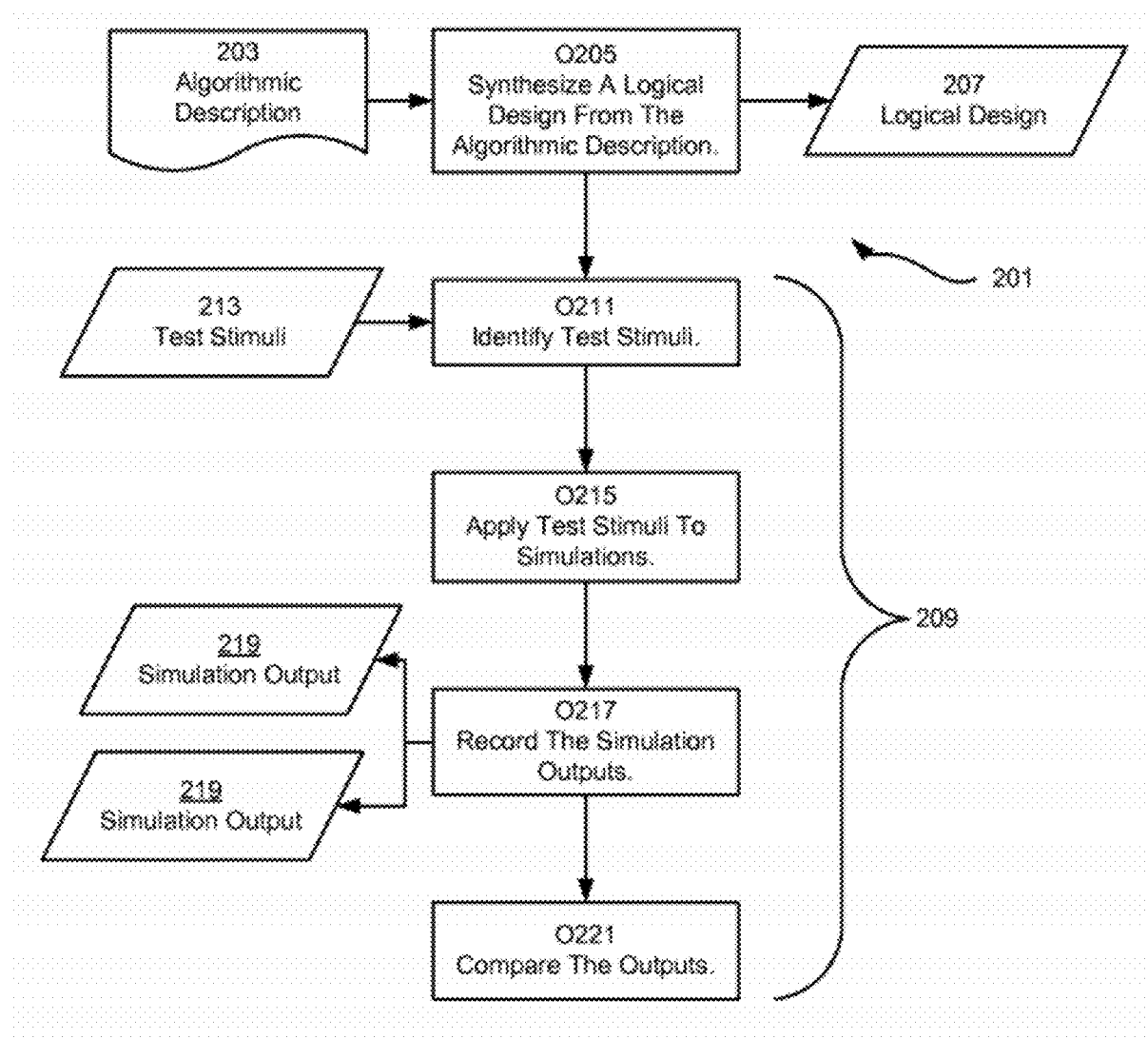
FIG. 2 illustrates a conventional verification flow.

As stated above, designs typically start at a high level of abstraction, such as, for example, as an algorithmic description 203 shown in FIG. 2. As can be seen from this figure, a method 201 for synthesizing and verifying a design is illustrated. The method 201 includes an operation 205 for synthesizing a logical design 207 from the algorithmic description 203. Subsequently, the logical design 207 can be verified against the algorithmic description 203 via a simulation process (e.g. 209). More particularly, as shown in this figure, the method 201 includes an operation 211 for identifying a set of test stimuli 213 to use during the simulation process 209, an operation 215 for applying the set of test stimuli 213 to a simulation of the algorithmic description 203 and a simulation of the logical design 207, an operation 217 for recording the outputs 219 from the algorithmic description 203 and the logical design 207, and an operation 221 for comparing the outputs 219.

A discrepancy in the outputs 219 indicates an error in the design, the simulation, or both. However, as explained above, concurrent logical designs, such as, for example, those synthesized from a non-sequential algorithmic description, may generate a different output from the simulation than the corresponding algorithmic description will, although both outputs are correct. As a result, conventional verification techniques, such as, for example, the method 201, as not suitable for verifying modern concurrent logical designs.

Concurrent Verification

Figure 3:
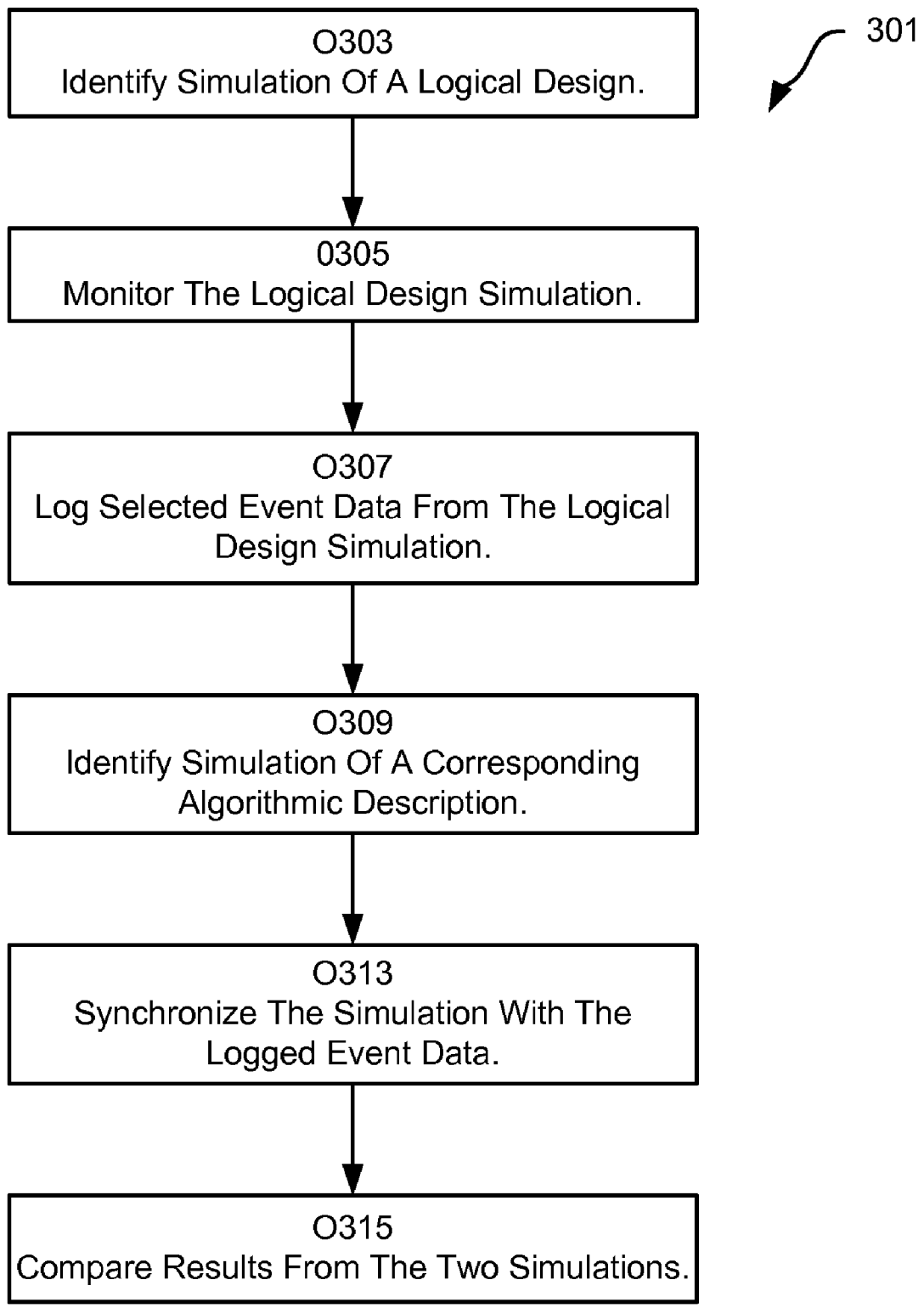
FIG. 3 illustrates a method of verifying a concurrent design according to various implementations of the invention.
Figure 4:
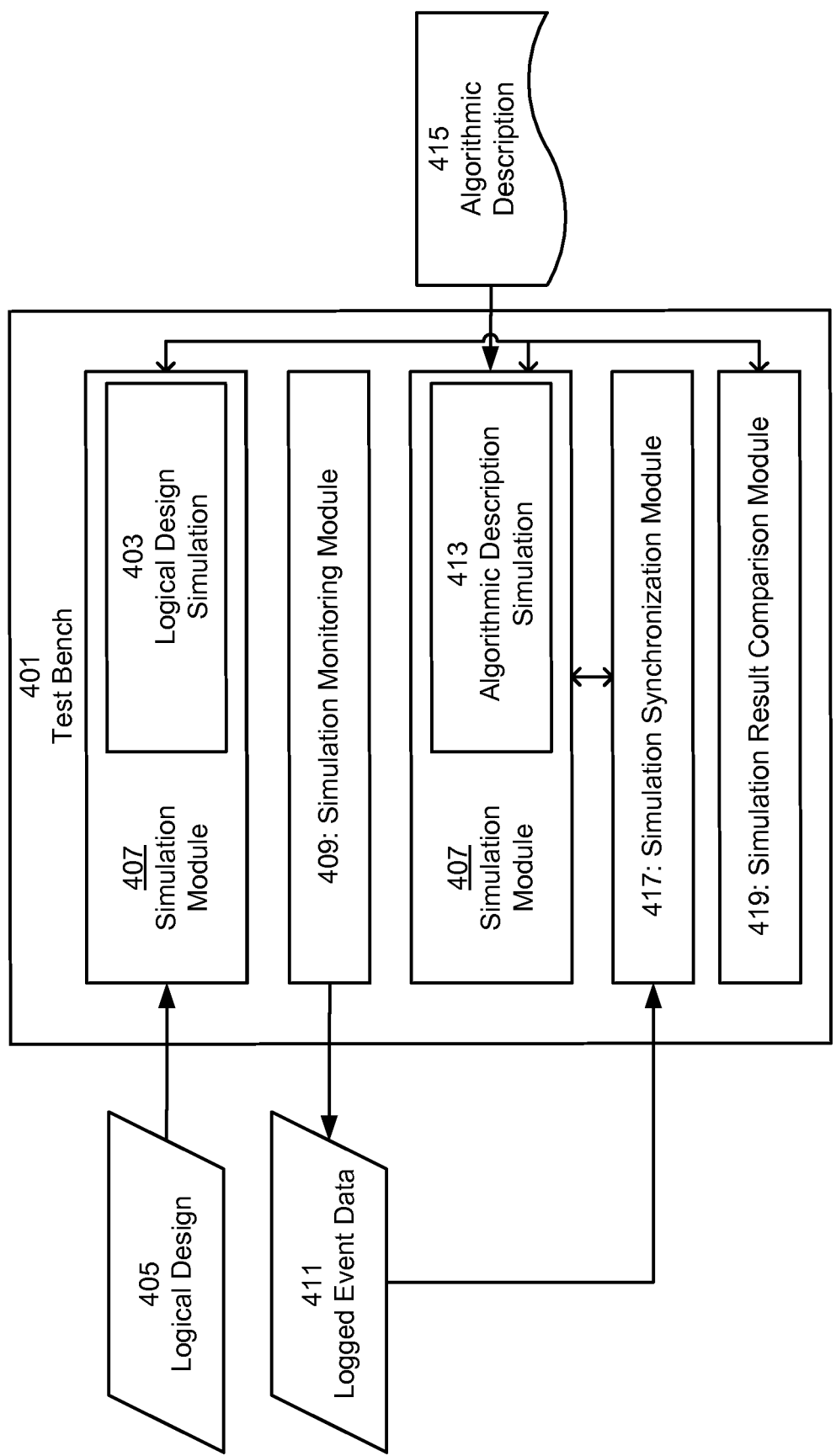
FIG. 4 illustrates a test bench configured to implement various examples of the invention.

As indicated, various implementations of the invention are applicable to enabling the verification of concurrent designs. An illustrative implementation will be described by reference to FIG. 3 and FIG. 4 below. FIG. 3 illustrates a method 301 for performing concurrent verification, which may be implemented according to various examples of the invention. As can be seen from this figure, the method 301 includes an operation 303 for identifying a simulation 403 of a logical design 405. Accordingly, FIG. 4 illustrates a test bench 401, which may be used to implement various examples of the invention. As shown, the test bench 401 includes a simulation module 407 that is used to implement the logical design simulation 403.

The method 301 further includes an operation 305 for monitoring the logical design simulation 403. The test bench 401 includes a monitoring module 409 that enables accessing the logical design simulation 403 during simulation (i.e. while the simulation is being actively executed) and capturing data related to the logical design simulation 403. As used herein, such data will be referred to as "event data." Examples of event data and illustrative techniques associated therewith will be described below. The method 301 additionally includes an operation 307 for logging selected event data 411 from the logical design simulation 403. In various implementations, the selected event data will be recorded into a text file and saved to a memory storage location.

Subsequently, the method 301 includes an operation 309 for identifying a simulation 413 of an algorithmic description 415 that corresponds to the logical design 405. In various implementations, the same simulation module 407 is used to implement both the logical design simulation 403 and the algorithmic description simulation 413. In alternative implementations, dedicated simulation modules 407 may be provided. The method 301 further includes an operation 313 for synchronizing the algorithmic description simulation 413 with the logged event data 411. A simulation synchronization module 417 is provided in the test bench 401 to facilitate the operation 313. Illustrative synchronization applications will be described below along with the further explanations of event data.

Lastly, the method 301 includes an operation 315 for comparing the results from the logical design simulation 403 and the algorithmic description simulation 413. Various options exist for determining a verification failure based on the operation 315 for comparing the simulation results. These options may depend upon the event data described below, and as such, will be addressed further in conjunction with the discussion of event data.

Illustrative Event Data Capturing and Synchronization

Figure 5:
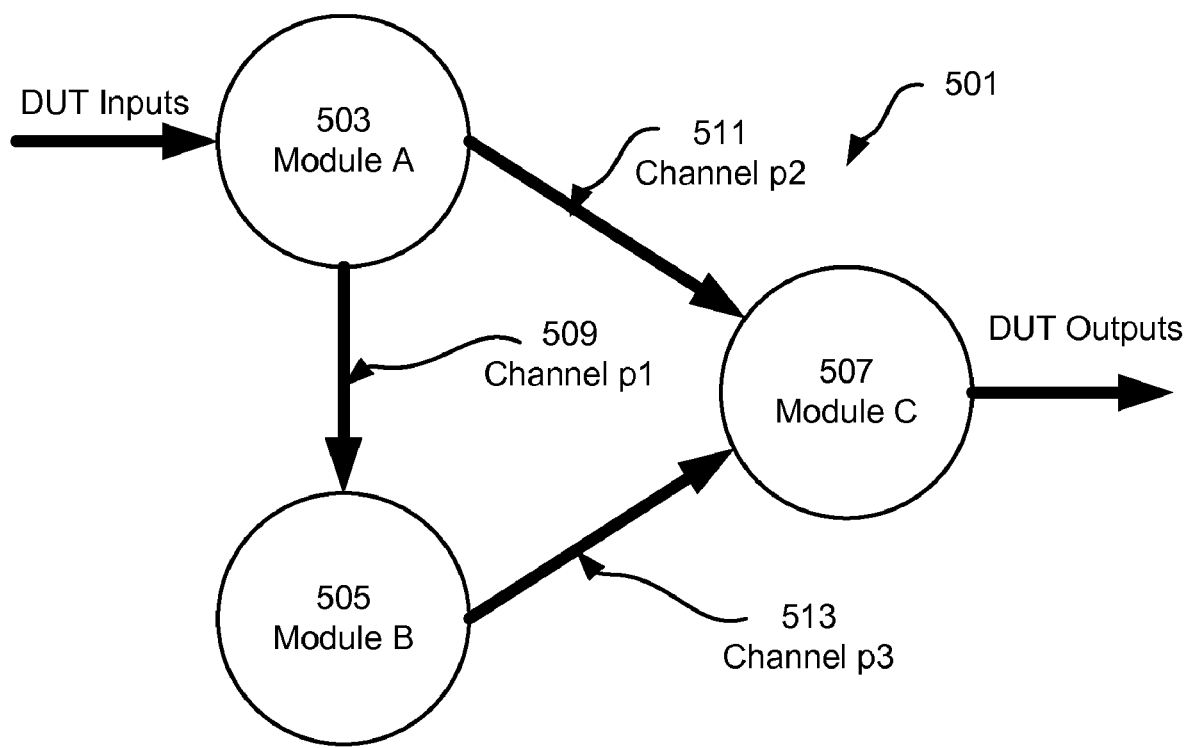
FIG. 5 illustrates a diagram of a device under test.

As described above, various implementations of the invention may be used to log or "record" event data during a simulation of a logical design, and subsequently, synchronize this event data with a simulation of a corresponding algorithmic description. The following discussion of illustrative event data, monitoring, and synchronization techniques, assumes that the structure of the algorithmic description is such that function calls at the top level or levels (e.g. hierarchically) become instances of modules in the logical design. For example, FIG. 5 illustrates a diagram of a device under test 501 having modules 503-507 and channels 509-513. This diagram may correspond to either the algorithmic description or the logical design. However, FIG. 6 illustrates an algorithmic description 601 that corresponds to the device under test 501. As can be seen from these figures, the modules and channels, as well as their interaction with each other are defined.

In the following description of illustrative event data, it is further assumed that data is passed between these functions exclusively through the specific channel objects provided by the logic simulation modules. For example, the Catapult® suite of tools from Mentor Graphics Corporation of Wilsonville, Oreg. utilizes a channel object called "ac_channel" that is used to transfer data between functions in a logical simulation.

As used herein, a module may refer to an algorithmic function as well as a hierarchical process in the logical design. It should be appreciated by those of skill in the art that a module, whether referring to a module in the algorithmic description or the logical design, refers to a self contained description of functional and behavioral characteristics of the design. The module communicates with the system via a "channel," as introduced above, and is often used in a hierarchical fashion. For a more detailed description of modules and channels, the reader is pointed towards the text, *Electronic Design Automation, Synthesis, Verification, and Test*, Laung-Teng Wang et al. eds., Morgan Kaufmann, 2009, which book is incorporated entirely herein by reference.

Still, it is further assumed that these channels are first-in first-out. In various implementations, the channels must be first-in first-out. Additionally, it may be assumed and that they are sized such that data is not lost as it moves between modules. Although this is not a requirement, it limits the temporal effects in this type of design to when the data appears at the interface of a module. Additionally still, it may be assumed that each channel is synthesized to an instance of a monitoring port, such as, for example "mgc_pipe" provided in the Catapult® suite of verification tools. This allows for the observation or request of data related to the channel, such as, for example when reads and writes are occurring.

Further still, it may be assumed that when the algorithmic description and the logical design evaluate (e.g. process inputs during simulation) identical input states, there is a one-to-one correlation of channel accesses made in both the algorithmic description and the logical design.

As illustrated in FIG. 3, the method 301 includes the operation 305 for monitoring the logical design simulation. In various implementations, the operation 305 monitors the inputs from the test bench 401 to the simulation 403, specific events occurring on the inter-module channels, such as, for example, the ac_channel, and the simulation results. With some implementations, the operation 305 monitors the channels for requests for the first-in first-out "size," which corresponds to a "read" of the channel state. In various implementations, the operation 305 monitors the channels for request to read data from the channel, which corresponds to a "write" of the channel state. This monitored information, such as, for example, the inputs, outputs, and channel reads and writes, is logged and stored as the event data 411.

Given the event data 411, the operation 313 may synchronize the simulation 413 with the event data, such that the outputs from the simulation 403 and the simulation 413 can be used to verify the logical design 405. In various implementations, the event data corresponding to the test bench inputs is used by the test bench as inputs during the algorithmic description simulation 413. Additionally, when functions, within the algorithmic description 415 are executed (e.g. during the simulation 413,) the methods of the channels involved in the execution are overridden to return the event data corresponding to the particular input and function execution triggering the channel activity. With some implementations, data written to a channel from the algorithmic description 415 is compared to the counterpart event data captured by the operation 307. With further implementations, the channel data may be synchronized with the captured event data if needed. This will be addressed in greater detail below. Alternatively, if the channel data differs from the event data, then the verification may fail.

For example, given the following test bench, which as can be seen, calls "top" (ie. the main function in the algorithmic description 601) multiple times may be used to illustrate event logging of non-blocking reads. As can be appreciated, a non-blocking read is a request to access data that returns immediately, even when non data is available.

```
int main( )
{
  int dout;
  for (int i = 0; i < 40; i++) {
    top(i, dout);
    std::cout << i << " " << dout << '\n';
  }
}
```

A sampling of events corresponding to a simulation of the logical design corresponding to the algorithmic description 601 is shown in Table 1. Each row shows the event log for a specific signal. However, as explained above, there is no temporal relationship among the rows. More particularly, B: p1:size returned 0 the 4th time it was called, therefore B: p1: data was not called for a 4th time until after the 5th (i.e. the $5^{th}$ column) call to, B: p1:size.

TABLE 1

| | Event # | | | | | |
|---|---|---|---|---|---|---|
| | 1 | 2 | 3 | 4 | 5 | 6 |
| A: din | 1 | 2 | 3 | 4 | 5 | 6 |
| B: p1:size | 1 | 1 | 1 | 0 | 1 | 1 |
| B: p1:data | 1 | 2 | 3 | 5 | 6 | 7 |
| C: p2:size | 0 | 0 | 1 | 0 | 1 | 0 |
| C: p2:data | 4 | 8 | 12 | 16 | 20 | 24 |
| C: p3:size | 0 | 1 | 2 | 1 | 2 | 3 |
| C: p3:data | 1 | 2 | 3 | 5 | 6 | 7 |
| C: dout | 0 (init) | 1 | 4 | 2 | 8 | 3 |

Note that the resulting output sequence, [0, 1, 4, 2, 8, 3] is not what one would expect, or get, when running the algorithmic description 601 alone or in a conventional verification environment. More particularly, Table 2 shows a stand-alone run of the algorithmic description 601, as it executes sequentially, and as a result, propagates data with "zero delay." Each column of this table represents a single iteration through the code. The rows are ordered sequentially as they would be called in the code. A dash indicates that the function was not called in the execution of that particular test iteration. Note that the resultant output sequence, [1, 2, 3, 4, 5, 6] does not match that of Table 1.

TABLE 2

| | Iteration # | | | | | |
|---|---|---|---|---|---|---|
| | 1 | 2 | 3 | 4 | 5 | 6 |
| A: din | 1 | 2 | 3 | 4 | 5 | 6 |
| B: p1::available(1) | T | T | T | F | T | T |
| B: p1::read( ) | 1 | 2 | 3 | — | 5 | 6 |
| C: p2::available(1) | F | F | F | T | F | F |
| C: p2::read( ) | — | — | — | 4 | — | — |
| C: p3::available(1) | T | T | T | — | T | T |
| C: p3::read( ) | 1 | 2 | 3 | — | 5 | 6 |
| C: dout | 1 | 2 | 3 | 4 | 5 | 6 |

Conversely, Table 3 shows the results from a simulation run of the algorithmic description using various implementations of the present invention. Note that the rows of Table 3 map instances of the functions channel (i.e. the channels 509-513) using the ac_channel raeture of Catapult®. Particularly, ac_channel::available and ac_channel::read are mapped to the accesses of size and data from Table 1, respectively. Also note, that (1) was considered true when size>=1).

Using various implementations of the invention, such as, for example, the method 301, the channel state is asserted to correlate with the data from the logical simulation for each module's evaluation. For example, the 3rd call of module C (i.e. module 507 in FIG. 5) sees the same input as the 3rd execution of the module 507 during the logical simulation. In various implementations, this is facilitated by providing responses to the function calls in the order they appear in Table 1. In this case, the correct ordering is left to right. It may be advantageous to manage each row of event data separately to increase efficiency and ensure that the event data remains available for the next event.

TABLE 3

| | Iteration # | | | | | |
|---|---|---|---|---|---|---|
| | 1 | 2 | 3 | 4 | 5 | 6 |
| A: din | 1 | 2 | 3 | 4 | 5 | 6 |
| B: p1::available(1) | T | T | T | F | T | T |
| B: p1::read( ) | 1 | 2 | 3 | — | 5 | 6 |
| C: p2::available(1) | F | F | T (F) | F (*) | T (F) | F |
| C: p2::read( ) | — | — | 4 (empty) | — | 8 (empty) | — |
| C: p3::available(1) | F (T) | T | — | T | — | T |
| C: p3::read( ) | — (1) | 1 | — | 2 | — | 3 |
| C: dout | 0 (init) | 1 | 4 | 2 | 8 | 3 |

As can be seen, the output sequence from Table 3 now matches the output sequence from Table 1. That is, the output sequences from the two simulations now match.

It is important to note, that when the function call available( ) returns false, yet data actually exists in the channel, such as, for example, p3::available(1) in iteration 1, a non-blocking read is effectively delayed until the next call at least. Assuming as stated above, that the channel is a first-in first-out channel of sufficient size, the data will be retained indefinitely in the order it was written by the upstream module and will be read at some point. As a result, the data is seen by the module in the algorithmic description simulation in the same iteration it appeared in the logical design simulation.

Additionally, it is important to note that the second call to p2::available(1) returned true (See p2::available(1), Iteration 3 and 5 in Table 3), though the first datum will not be available (even with zero delay) until the 4th iteration (see row of A: din). In general, this occurs when a module evaluation occurs sooner, in relation to upstream modules' events or test input, in an algorithmic simulation that in a logical simulation. In the example corresponding to the above tables, module 507 (i.e. module C) was reading its inputs slower by several clock cycles, such that module 503 (i.e. module A), executing in parallel, wrote the '4' prior to C's third evaluation. The delay and concurrence that allows this to happen is not modeled in the high-level programming languages used to describe circuits, such as, for example, C++. See p2::available(1), Iteration 4 in Table 3 for example.

When available( ) returns true when no data exists in the channel, various implementations will supply the requesting module with the event data. When this occurs, it is assumed that the delivering module will eventually deliver the exact data just advanced. If not, a validation error may be triggered and the validation may be marked as failing. However, when the correct data does appear from the module, it must be removed from the channel so as to avoid duplication.

What is claimed is:

1. A computer-implemented method for enabling a verification of a non-sequential hardware design synthesis, the method comprising:
   identifying a non-sequential algorithmic description for a hardware design;
   identifying a register transfer level description corresponding to the hardware design;
   identifying a simulation run implemented on the register transfer level description;
   logging inputs applied to the register transfer level description during the simulation run;
   logging selected events occurring during the simulation run;
   logging outputs received from the register transfer level description during the simulation run;
   implementing a verification run on the non-sequential algorithmic description, wherein the logged inputs are used as inputs to the verification run, and the logged selected events are synchronized with corresponding events in the verification run; and
   saving outputs from the verification run to a memory storage location.

2. The computer-implemented method recited in claim 1, the method act for logging selected events occurring during the simulation run comprising:
   identifying a channel within the simulation run;
   monitoring the channel during the simulation run; and
   recording events occurring on the channel during the simulation run onto a non-transitory memory storage location.

3. The computer-implemented method recited in claim 2, wherein the events are: inputs to the channel;
   outputs from the channel;
   requests to read data from the channel; and requests to write data to the channel.

4. The computer-implemented method recited in claim 3, the method act for implementing a verification run on the non-sequential algorithmic description comprising:
   causing the non-sequential algorithmic description to be simulated, wherein the logged inputs are used as inputs to a simulation;
   identifying a channel within the simulation that corresponds to the channel within the simulation run;
   monitoring the channel during the simulation; and
   synchronizing recorded event data with the channel during the simulation run.

5. The computer-implemented method recited in claim 4, the method act of synchronizing recorded event data comprises causing the data within the channel to correspond to the recorded event data.

6. The computer-implemented method recited in claim 5, further comprising:
   comparing the logged outputs to the saved outputs, wherein a result is generated;
   saving the result to a non-transitory memory storage location; and
   providing the result to a user.

7. The computer-implemented method recited in claim 2, wherein the events are inputs to the channel.

8. The computer-implemented method recited in claim 2, wherein the events are outputs of the channel.

9. The computer-implemented method recited in claim 2, wherein the events are requests to read data from the channel.

10. The computer-implemented method recited in claim 2, wherein the events are requests to write data to the channel.

11. One or more non-transitory computer-readable media having computer executable instructions stored thereon, the one or more non-transitory computer-readable media comprising:
    a plurality of computer executable instructions for causing a computer to perform a method non-transitorily stored thereon, the method including:
    identifying a non-sequential algorithmic description for a hardware design;
    identifying a register transfer level description corresponding to the hardware design;
    identifying a simulation run implemented on the register transfer level description;
    logging inputs applied to the register transfer level description during the simulation run;
    logging selected events occurring during the simulation run;
    logging outputs received from the register transfer level description during the simulation run;
    implementing a verification run on the non-sequential algorithmic description, wherein the logged inputs are used as inputs to the verification run, and the logged events are synchronized with corresponding events in the verification run; and
    saving outputs from the verification run to a memory storage location.

12. The one or more non-transitory computer-readable media recited in claim 11, the method act for logging selected events occurring during the simulation run comprising:
    identifying a channel within the simulation run;
    monitoring the channel during the simulation run; and
    recording events occurring on the channel during the simulation run onto a non-transitory memory storage location.

13. The one or more non-transitory computer-readable media recited in claim 12, wherein the events are:
    inputs to the channel;
    outputs from the channel;
    requests to read data from the channel; and
    requests to write data to the channel.

14. The one or more non-transitory computer-readable media recited in claim 13, the method act for implementing a verification run on the non-sequential algorithmic description comprising:
    causing the non-sequential algorithmic description to be simulated, wherein the logged inputs are used as inputs to a simulation;
    identifying a channel within the simulation that corresponds to the channel within the simulation run;
    monitoring the channel during the simulation; and
    synchronizing recorded event data with the channel during the simulation run.

15. The one or more non-transitory computer-readable media recited in claim 14, the method act of synchronizing recorded event data comprises causing the data within the channel to correspond to the recorded event data.

16. The one or more non-transitory computer-readable media recited in claim 15, the method further comprising:
   comparing the logged outputs to the saved outputs, wherein a result is generated;
   saving the result to a non-transitory memory storage location; and
   providing the result to a user.

17. A system for verifying a non-sequentially synthesized circuit design comprising:
   a first simulation module configured to implement a simulation of an algorithmic description corresponding to an electronic design;
   a second simulation module configured to implement a simulation of the electronic design;
   a simulation monitoring module configured to monitor the simulation of the electronic design and capture event data related to the simulation of the electronic design;
   a simulation synchronization module configured to synchronize the captured event data with the simulation of the algorithmic description; and
   a simulation result comparison module configured to compare a result of the simulation of the algorithmic description and a result of the simulation of the electronic design.

* * * * *